United States Patent
Zhao et al.

(10) Patent No.: US 7,504,838 B1
(45) Date of Patent: Mar. 17, 2009

(54) METHODS OF DETERMINING CHARACTERISTICS OF DOPED REGIONS ON DEVICE WAFERS, AND SYSTEM FOR ACCOMPLISHING SAME

(75) Inventors: Zhiyong Zhao, Austin, TX (US); Christian Krueger, Liegau-Augustusbad (DE)

(73) Assignee: Advanced Micro Devices, Inc., Austin, TX (US)

( * ) Notice: Subject to any disclaimer, the term of this patent is extended or adjusted under 35 U.S.C. 154(b) by 424 days.

(21) Appl. No.: 11/381,239

(22) Filed: May 2, 2006

Related U.S. Application Data

(62) Division of application No. 10/900,832, filed on Jul. 28, 2004, now Pat. No. 7,063,991.

(51) Int. Cl.
*G01R 31/02* (2006.01)
(52) U.S. Cl. .................................................... 324/750
(58) Field of Classification Search .................. None
See application file for complete search history.

(56) References Cited

U.S. PATENT DOCUMENTS

| | | | | |
|---|---|---|---|---|
| 5,087,876 | A | 2/1992 | Reiss et al. ................. | 324/767 |
| 5,477,325 | A | 12/1995 | Miyashita et al. ........... | 356/630 |
| 5,494,697 | A | 2/1996 | Blayo et al. .................. | 427/10 |
| 5,661,408 | A | 8/1997 | Kamieniecki et al. ....... | 324/765 |
| 5,769,540 | A | 6/1998 | Schietinger et al. ......... | 374/127 |
| 5,825,482 | A | 10/1998 | Nikoonahad et al. ....... | 356/237.2 |
| 6,072,897 | A | 6/2000 | Greenberg et al. .......... | 382/144 |
| 6,097,196 | A * | 8/2000 | Verkuil et al. ................ | 324/750 |
| 6,388,455 | B1 | 5/2002 | Kamieniecki et al. ....... | 324/752 |
| 6,512,384 | B1 | 1/2003 | Lagowski et al. ........... | 324/752 |
| 6,660,543 | B1 | 12/2003 | Stirton et al. ................ | 438/16 |
| 6,950,190 | B2 | 9/2005 | Smith .......................... | 356/446 |
| 7,063,991 | B1 * | 6/2006 | Zhao et al. ................... | 438/14 |
| 7,064,565 | B1 * | 6/2006 | Xu et al. ...................... | 324/750 |
| 7,075,318 | B1 * | 7/2006 | Zhang et al. ................ | 324/750 |
| 7,119,569 | B2 * | 10/2006 | Steeples ...................... | 324/765 |
| 7,397,254 | B1 * | 7/2008 | Zhang et al. ................ | 324/750 |
| 2004/0046585 | A1 | 3/2004 | Kamienecki et al. ....... | 324/765 |
| 2008/0182347 | A1 * | 7/2008 | Steeples et al. .............. | 438/17 |

OTHER PUBLICATIONS

QC Solutions, Inc., Semiconductor Process Monitoring, Epi Implant, Version 2.1, 2004.

* cited by examiner

*Primary Examiner*—Jermele M Hollington
(74) *Attorney, Agent, or Firm*—Williams, Morgan & Amerson, P.C.

(57) ABSTRACT

Disclosed herein are various methods of determining characteristics of doped regions on device wafers, and a system for accomplishing same. In one illustrative embodiment, the method includes providing a device substrate comprising a plurality of masked areas, a plurality of unmasked areas, and at least one doped region formed in the substrate, determining a ratio between the unmasked areas and the masked areas for the device substrate, illuminating an area of the device substrate comprising the masked areas, the unmasked areas, and at least one doped region, and measuring an induced surface photovoltage of the device substrate while accounting for the ratio of the unmasked areas and the masked areas of the device substrate. In another illustrative embodiment, the method includes providing an SOI substrate comprised of an active layer, the active layer having a thickness, illuminating an area of the substrate using a light source having a wavelength that is sufficiently long such that an excited region created in the active layer due to the illumination does not extend beyond the thickness of the active layer, and measuring an induced surface photovoltage resulting from the illumination.

26 Claims, 6 Drawing Sheets

METHODS OF DETERMINING CHARACTERISTICS OF DOPED REGIONS ON DEVICE WAFERS, AND SYSTEM FOR ACCOMPLISHING SAME

CROSS-REFERENCE TO RELATED APPLICATION

This application is a DIV of Ser. No. 10/900,832 filed on Jul. 28, 2004 now U.S. Pat. No. 7,063,991.

BACKGROUND OF THE INVENTION

1. Field of the Invention

This invention relates generally to semiconductor metrology technology, and, more particularly, to various methods of determining characteristics of doped regions on device wafers, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10 is depicted in FIG. 1. The field effect transistor 10 may be formed above a surface 15 of a semiconducting substrate 12, such as a doped silicon wafer. The substrate 12 may be doped with either N-type or P-type dopant materials. The transistor 10 may have a doped-polycrystalline silicon (polysilicon) gate electrode 14 formed above a gate insulation layer 16 that is formed above the surface 15 of the semiconducting substrate 12. The gate electrode 14 and the gate insulation layer 16 may be separated from doped source/drain regions 22 of the transistor 10 by a dielectric sidewall spacer 20. The sidewall spacer 20 may be formed above shallow source/drain extension regions 23. The source/drain regions 22 for the transistor 10 may be formed by performing one or more ion implantation processes to introduce dopant atoms, e.g., arsenic or phosphorous for NMOS devices, boron for PMOS devices, into the substrate 12. Shallow trench isolation regions 18 may be provided to electrically isolate the transistor 10 from neighboring semiconductor devices such as other transistors (not shown). The methodologies employed in forming such a transistor are well known to those skilled in the art.

When the transistor 10 is operational, i.e., when it is turned "ON" by applying the appropriate voltage to the gate electrode 14, a channel region 13, indicated by dashed lines, will be established in the substrate 12 between the source/drain regions 22. During operation, electrons will flow between the source/drain regions 22 in the channel region 17. The distance between the source/drain regions 22 is generally referred to as the "channel length" of the transistor 10, and it approximately corresponds to the length 12 of the gate electrode 14, i.e., the so-called critical dimension of the gate electrode 14. Channel length, at least in part, determines several performance characteristics of the transistor 10, such as switching speed.

FIG. 2 is a plan view of an illustrative semiconducting wafer 11 having a plurality of die 24 formed thereon. The die 24 represent areas of the wafer 11 wherein production integrated circuit devices, e.g., microprocessors, memory devices, bipolar devices, etc. may be formed. The number of die 24 per wafer may vary depending upon the particular application and the overall size of the wafer 11. For example, in connection with the fabrication of modern microprocessor devices, a typical 8-inch wafer has several hundred individual die positioned on the wafer 11. The area between the individual die is sometimes referred to as scribe lines 25. The relative size of the die 24 and the scribe lines 25 is exaggerated in FIG. 2 for purposes of clarity. Ultimately, after the fabrication of the production integrated circuit devices is complete, the wafer will be cut and the individual production devices will be tested, packaged and sold.

In manufacturing modern integrated circuit devices, various process operations are performed on the wafer 11 in a desired sequence so as to produce the integrated circuit device. Such process operations may include deposition processes, etching processes, annealing processes, planarization processes, and ion implantation processes. As indicated above, various implant regions are typically formed as a part of the process of manufacturing an integrated circuit device. Such implant regions are typically formed by performing one or more ion implantation processes and/or by performing one or more thermal diffusion processes. The ability to precisely control the characteristics of such doped regions, e.g., dopant species, concentration, implant profile, activation grade, etc., is critical in the formation of modern, high performance integrated circuit devices. In some cases, even slight variations in the characteristics of the doped regions versus the planned characteristics of such doped regions can adversely impact the performance capability of the resulting integrated circuit device.

Over the past several years, the gate length 12 of field effect transistors on modern high performance integrated circuit devices has been reduced to the level such that current generation transistor devices have a critical dimension on the order of approximately 40-70 nm, and further reductions are planned in the future. As the critical dimensions decrease, the depth and characteristics of the doped regions associated with such devices also tends to decrease. For example, using current technology, the source/drain regions 22 for such a transistor 10 may have a depth on the order of approximately 20-100 nm, whereas the extension regions 23 may have a depth on the order of approximately 10-20 nm. It is also important that the doped regions have the correct concentration of dopant material in order to function properly. Thus, the ability to control and determine the characteristics of doped regions in modern devices becomes ever more important. It should be understood that controlling the characteristics of the doped regions is equally important with other types of implants, e.g., halo implant regions, threshold voltage implant regions, etc. Doped regions that are also important in some modern semiconductor devices involve the formation of various doped wells, e.g., CMOS technology, bipolar transistors, etc.

As will be appreciated by those skilled in the art, various techniques are employed in an effort to insure that the doped regions are formed to their desired target characteristics, e.g., depth, dopant concentration, etc. In some cases, various ion implantation processes are performed on test wafers that are ultimately cross-sectioned and examined with a scanning electron microscope (SEM) or secondary ion mass spectrometry (SIMS) metrology tools to determine one or more characteristics of the doped regions. Such testing methodologies are expensive in that they involve at least partially processing the test wafers and, thereafter, performing the cross-sectioning and inspection activities to determine the characteristics of the doped regions. Moreover, such test wafers typically do not include any production devices. Additionally, in using such a testing methodology, there may be an unacceptable delay in receiving the results of such tests.

Efforts have been made to develop non-destructive methodologies for determining the characteristics of doped regions formed in manufacturing semiconductor devices. Typically, prior to performing an ion implantation process, a patterned layer of photoresist will be formed above the surface of the wafer. Thereafter, one or more ion implantation processes may be performed into the exposed silicon areas (as defined by the patterned masking layer) to form various doped regions therein. As indicated above, given the very small size of various features formed on a modern integrated circuit device, the size of such openings in the patterned layer of photoresist is very small, e.g., less than one micron. One vendor, Thermawave (of Fremont, Calif.), provides a metrology system wherein a laser is used in an effort to determine the characteristics of doped regions. The Thermawave instrument has pattern recognition capability that allows the device to locate the open areas within the patterned layer of photoresist such that the laser beam may be directed to the exposed silicon surface in an effort to determine the characteristics of the doped region. Unfortunately, in some applications, the Thermawave instrument lacks the required sensitivity to determine any meaningful information regarding the characteristics of the doped regions. For example, when the dopant concentration is relatively high, the Thermawave instrument provides little meaningful feedback due to its limited sensitivity. In these applications, if employed, the Thermawave-type instrument is used as a "GO/NO GO" check to determine if dopant material is present in the inspected region only. That is, due to its limited sensitivity, if such a device detects the presence of any dopant material, it is assumed that the correct amount of dopant material is present in the inspected region.

Another technique for determining the characteristics of doped regions involves performing a surface photovoltage charge metrology process to determine the characteristics of the doped regions. In accordance with this technique, a modulated beam of collimated light from a light source, e.g., blue or white light, is used to illuminate the desired area to be inspected. Based upon the measured surface photovoltage, characteristics of the doped region, e.g., dopant concentration, may be determined. However, the size of the light beam used in such metrology tools to illuminate the desired inspection target may be relatively large, e.g., approximately 1-2 mm. Unfortunately, with modern integrated circuit devices, the doped regions in need of inspection are much smaller than the size of the light beam used in traditional surface photovoltage metrology techniques.

Another non-destructive technique that is sometimes employed to determine one or more characteristics involves performing various electrical tests, e.g., resistivity, using a four-point probe. However, using such techniques involves waiting until an anneal process has been performed to activate the implanted dopant atoms. Due to a variety of reasons, there are limitations on when such an anneal process may be performed. Typically, such anneal processes are performed at the later stages of manufacturing. Thus, results from such electrical tests are not as timely as would otherwise be desired. Additionally, the physical size of the probes is relatively large and, therefore, such a testing methodology may be of limited use in connection with the testing of modern semiconductor devices which have very small doped regions. Moreover, such contact testing techniques may result in damage to the tested device.

When doped regions are formed in silicon-on-insulator substrates, traditional surface photovoltage measurement techniques are not very effective. FIG. 3 depicts an illustrative silicon-on-insulator substrate 100 comprised of a bulk layer 100A, a buried insulation layer 100B (a so-called "box" layer), and an active layer 100C. The active layer 100C has a surface 100S, and an interface 102 is present between the active layer 100C and the buried insulation layer 100B.

Traditional surface photovoltage metrology tools, like the one referenced above from QC Solutions, Inc., use light sources having relatively high energy levels, e.g., blue and white light sources. As stated above, dimensions of integrated circuit devices continue to shrink and, as a result, the depths of the doped regions become shallower and the profiles of the doped regions become steeper. Additionally, the depth 101 of the active layer 100C of an SOI structure also continues to decrease. For example, the depth 101 of the active layer 100C on SOI structures 100 employed in manufacturing current day integrated circuit devices may be approximately 800 nm, and further reductions are anticipated.

Unfortunately, the energy levels of light sources employed in existing surface photovoltage metrology tools is too high and the excited region goes beyond the interface 102 between the active layer 100C and the buried insulation layer 100B. Typically, the active layer 100C is comprised of silicon and the buried insulation layer 100B is comprised of silicon dioxide. The penetration of the excited region beyond the interface 102 causes such tools to be very insensitive as it relates to the measurement of one or more characteristics of various doped regions formed in the active layer 100C. This is believed to occur in at least some cases because oxygen tends to react to the silicon to form a dielectric capacitor. This may occur because the high energy light may generate electrons in the active zone below the transistor 10 and it is not possible to discharge this area due to the buried insulation layer 100B. As a result, a dielectric capacitor will be formed.

The present invention is directed to various methods and systems that may solve, or at least reduce the effects of, some or all of the aforementioned problems.

SUMMARY OF THE INVENTION

The present invention is generally directed to various methods of determining characteristics of implant regions on device wafers, and a system for accomplishing same. In one embodiment, the method comprises providing a device substrate comprising a plurality of masked areas, a plurality of unmasked areas, and at least one doped region formed in the substrate, determining a ratio between the unmasked areas and the masked areas for the device substrate, illuminating an area of the device substrate comprising the masked areas, the unmasked areas, and the at least one doped region, and measuring an induced surface photovoltage of the device substrate while accounting for the ratio of the unmasked areas and the masked areas of the device substrate. One or more characteristics of the doped region may be determined based upon the measured surface photovoltage. In further embodiments, the method comprises modifying at least one parameter of a process operation used to form the at least one doped region and performing the process operation comprised of the modified parameter on at least one subsequently processed device substrate to form a doped region therein.

In another illustrative embodiment, the method comprises providing a device substrate comprised of silicon, the device substrate comprising a plurality of masked areas, a plurality of unmasked areas, and at least one doped region formed in the substrate, determining a ratio of the unmasked areas to the masked areas for the device substrate, illuminating an area of the device substrate comprising the masked areas, the unmasked areas, and the at least one doped region, and measuring an induced surface photovoltage of the device substrate while accounting for the ratio of the unmasked areas to the masked areas of the device substrate.

In yet another illustrative embodiment, the method comprises providing a device substrate comprised of silicon, the device substrate comprising a plurality of masked areas, a plurality of unmasked areas, and at least one doped region formed in the substrate, determining a ratio of the masked areas to the unmasked areas for the device substrate, illuminating an area of the device substrate comprising the masked areas, the unmasked areas, and the at least one doped region, and measuring an induced surface photovoltage of the device substrate while accounting for the ratio of the masked areas to the unmasked areas of the device substrate.

In a further illustrative embodiment, the method comprises providing an SOI substrate comprised of an active layer, the active layer having a thickness, illuminating an area of the substrate using a light source having a wavelength that is sufficiently long such that an excited region created in the active layer due to the illumination does not extend beyond the thickness of the active layer, and measuring an induced surface photovoltage resulting from the illumination. In further embodiments, the method comprises modifying at least one parameter of at least one process operation to be performed on at least one subsequently processed SOI substrate based upon the measured surface photovoltage and performing at least one process operation comprised of the modified at least one parameter on at least one subsequently processed SOI substrate.

In yet a further illustrative embodiment, the method comprises providing an SOI substrate comprised of an active layer, the active layer having a thickness and at least one doped region formed therein, illuminating an area of the substrate including at least a portion of the at least one doped region using a light source having a wavelength that is sufficiently long such that an excited region created in the active layer due to the illumination does not extend beyond the thickness of the active layer, measuring an induced surface photovoltage resulting from the illumination, and determining at least one characteristic of the at least one doped region based upon the measured induced surface photovoltage.

BRIEF DESCRIPTION OF THE DRAWINGS

The invention may be understood by reference to the following description taken in conjunction with the accompanying drawings, in which like reference numerals identify like elements, and in which.

Figure 1:
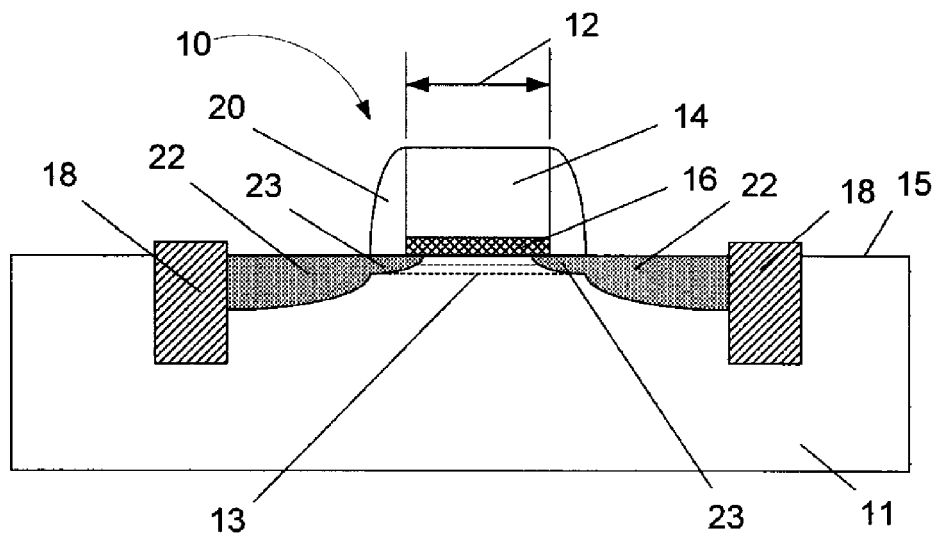
FIG. 1 is a cross-sectional view of an illustrative prior art transistor.
Figure 2:
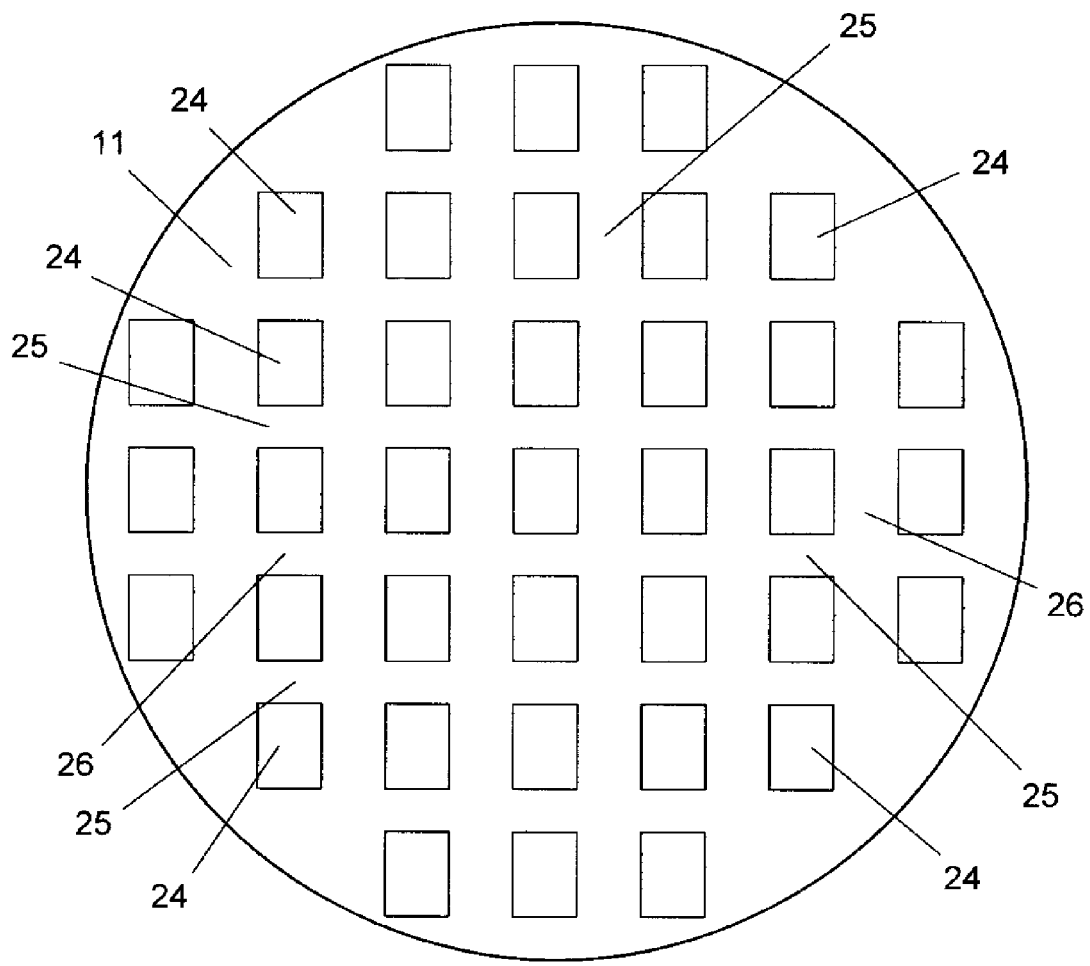
FIG. 2 depicts a top view of an illustrative prior art wafer.
Figure 3:
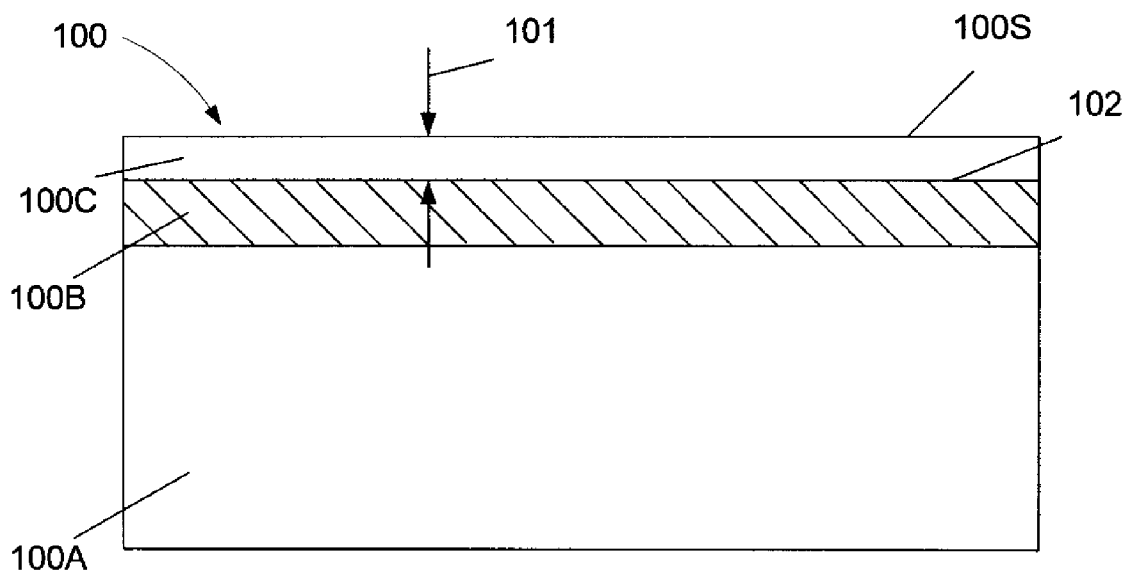
FIG. 3 depicts a cross-sectional view of an illustrative prior art SOI substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems, doped regions, devices and tools may be schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of determining characteristics of doped regions on device wafers, and a system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, bipolar devices, etc. Moreover, the present invention may be employed in connection with any of a variety of different types of doped regions, e.g., extension regions, source/drain regions, halo implant regions, threshold voltage implant regions, well regions (N or P wells), etc. Such illustrative doped regions may be formed using any of a variety of known techniques, e.g., ion implantation, diffusion. In forming such doped regions by performing one or more ion implantation processes, any parameter of the implant recipe may be varied. For example, parameters such as dose, energy, dopant type (N or P type), as well as the angle of the implant process, may be varied. Thus, the present invention should not be considered as limited to any type of doped region, the manner in which it is formed, or to the type of dopant material employed.

Figure 4A:
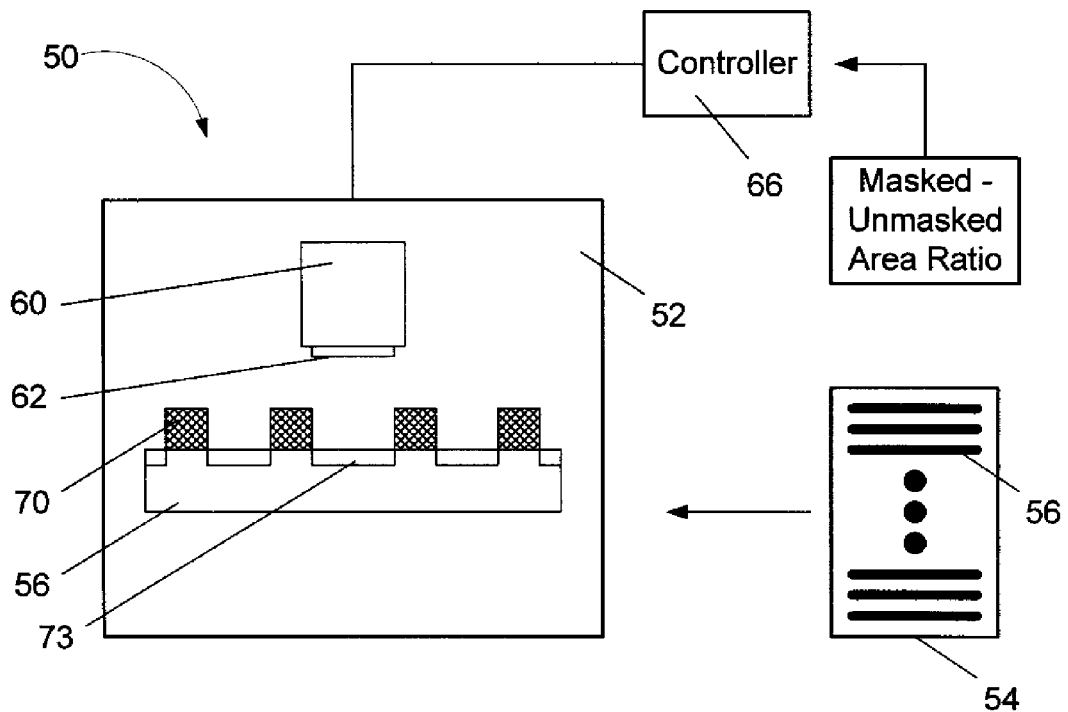
FIGS. 4A-4B depict various aspects of an illustrative system in accordance with one illustrative embodiment of the present invention.
Figure 4B:
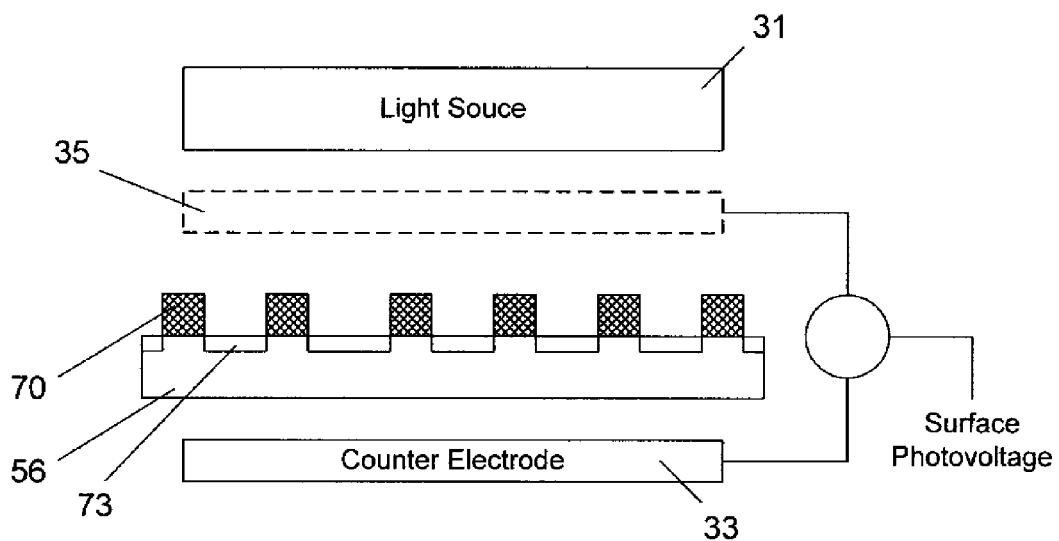

FIGS. 4A-4B depict various aspects of a system 50 in accordance with one illustrative embodiment of the present invention. As shown in FIG. 4A, the system 50 comprises a surface photovoltage measurement tool 52 and a controller 66. An illustrative lot 54 comprised of a plurality of semiconducting substrates 56, e.g., semiconducting wafers, is to be processed in the surface photovoltage measurement tool 52. As indicated in FIG. 4A, an illustrative semiconducting substrate 56, having a patterned masking layer 70 formed thereabove, is positioned within the tool 52. The surface photovoltage tool 52 further comprises a probe head 60 and a surface photovoltage electrode 62. In general, any type of tool 52 that is capable of measuring surface photovoltage levels may be employed with the present invention. In one illustrative embodiment, the surface photovoltage tool 52 may be a Model No. QCS-ICT 300 manufactured by QC Solutions, Inc. of Wortham, Mass. Certain operational aspects of such a tool may be described in U.S. Pat. No. 5,661,408 and U.S. Patent Application Publication No. 2004/0046585 A1, both of which are hereby incorporated by reference in their entirety.

It should be understood that the semiconducting substrates 56 are intended to be illustrative in nature. That is, the semiconducting substrates 56 may be any type of semiconducting substrate comprised of any type of semiconducting material, and the substrates 56 may be in any of a variety of different forms. For example, the semiconducting substrate 56 may be a bulk silicon wafer having a layer of epitaxial silicon formed thereon, or it may be a silicon-on-insulator (SOI) structure. In one illustrative embodiment, the substrates 56 are device substrates used in normal production activities. That is, the substrates 56 may have a plurality of partially formed production integrated circuit devices positioned thereon where it is desired to measure one or more doped regions formed in the substrate 56. The production integrated circuit devices on the device substrates 56 will ultimately be sold in the marketplace when manufacturing and testing operations are complete. The device substrates or wafers 56 are to be understood to be in contrast to test wafers wherein various non-production integrated circuit devices, or portions thereof, may be formed thereon for various testing purposes.

Figure 5A:
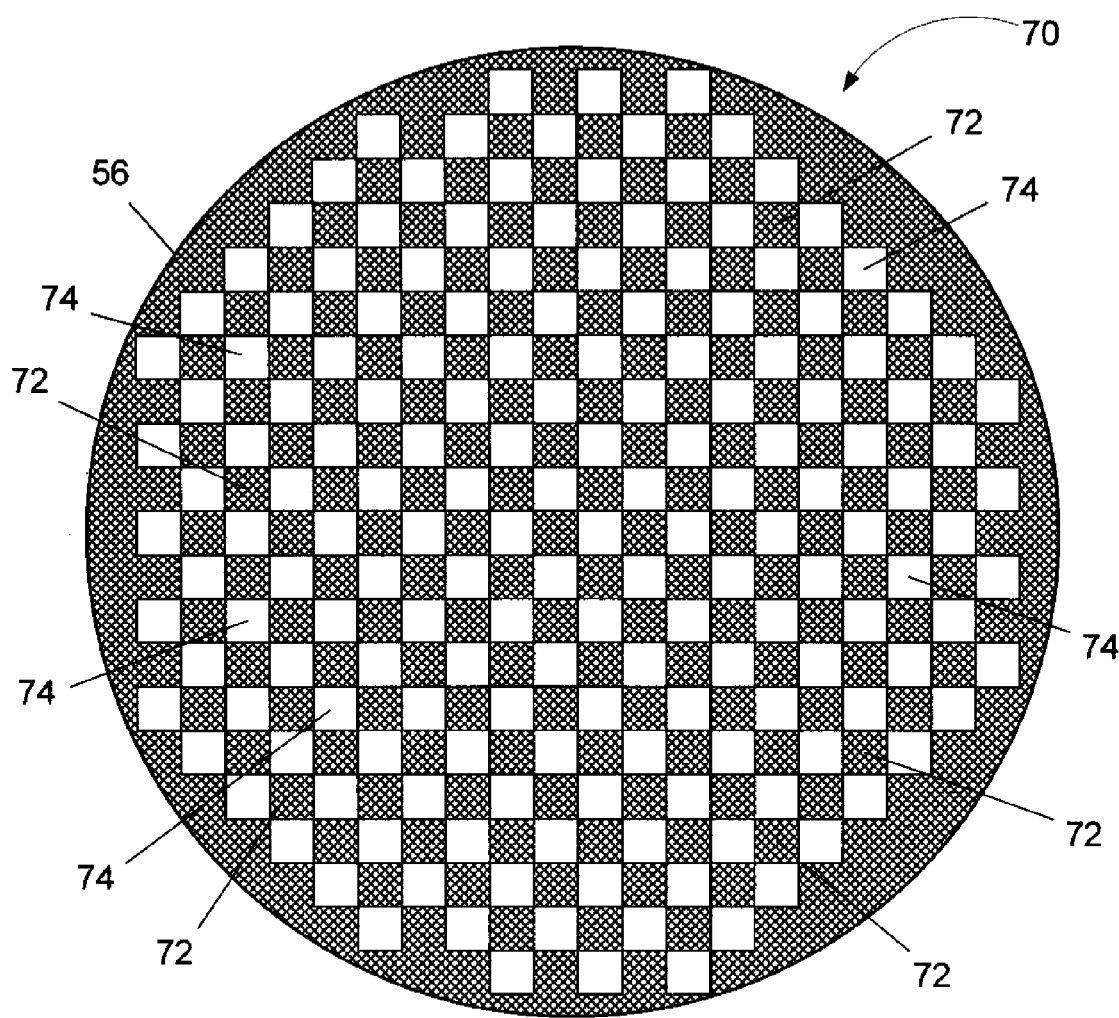
FIGS. 5A-5B are, respectively, a plan view and a side view of an illustrative wafer having a patterned masking layer formed thereabove.
Figure 5B:
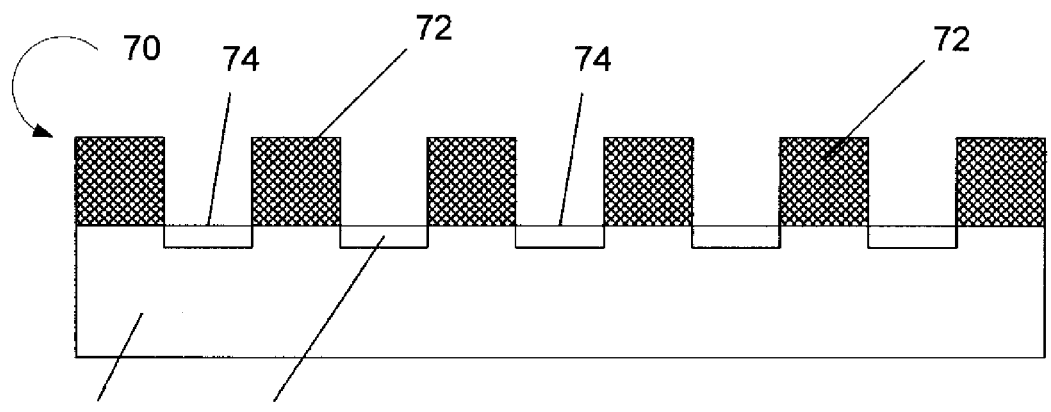

FIGS. 5A-5B are, respectively, plan and side views of an illustrative substrate 56 having a patterned masking layer 70 formed thereabove. As can be seen in FIG. 5A, the patterned masking layer 70 defines a plurality of masked areas 72 and a plurality of unmasked areas 74. In one particular embodiment, the patterned masking layer 70 may be formed directly on the surface 57 of the substrate 56 wherein the unmasked areas 74 reflect exposed areas of the surface of the substrate 56. FIG. 5B depicts a plurality of illustrative doped regions 73 formed in the substrate 56. The patterned masking layer 70 may be made of a variety of materials and it may be formed in accordance with a variety of known techniques. For example, the patterned masking layer 70 may be comprised of a layer of photoresist material (positive or negative) that may be patterned using known photolithography tools and techniques. In some embodiments, the patterned masking layer 70 may be a so-called "hard mask" material, e.g., silicon nitride, formed by depositing a layer of material and performing one or more etching processes to define the patterned masking layer 70. It should be clear from the foregoing that the present invention should not be considered as limited to any particular type of material for the patterned masking layer 70 or to the manner in which it was formed. Moreover, the present invention is not limited to any particular pattern formed by the patterned masking layer 70. The illustrative "checkerboard" type pattern depicted in FIG. 5A is provided by way of example only and for purposes for explaining various aspects of the present invention.

In general, as indicated in FIGS. 4A-4B, in accordance with one aspect of the present invention, the surface photovoltage tool 52 is used to measure the photo-induced voltage at the surface of a doped region formed in the substrate 56. In this method, a modulated beam of collimated light from the light source 31 is directed at a region of the substrate 56 and the photo-induced change in electrical potential at the surface is measured. The substrate 56 is capacitively coupled during the measurement process, i.e., there is no direct electrical contact. As indicated in FIG. 4B, the induced surface photovoltage is measured between a counter electrode 33 and a transparent electrode 35. The wavelength of the illuminating light is selected to be shorter than the wavelength of light corresponding to an energy gap of the semiconducting material undergoing testing. The intensity of the light beam is modulated with both the intensity of the light and the frequency of modulation being selected such that the resulting AC component of the induced photovoltage is directly proportional to the intensity of the light and inversely proportional to the frequency of the modulation. The exact mechanisms of the operation of the surface photovoltage tool may be further determined by reference to the aforementioned U.S. Pat. No. 5,661,408 and U.S. Patent Publication No. 2004/0046585. The surface photovoltage tool 52 may be used to determine one or more characteristics of various doped regions either before or after the performance of any anneal process that may be performed. Such characteristics may include dopant concentration, profile and species, activation grade, etc.

In accordance with one aspect of the present invention, the surface photovoltage tool 52 is used to illuminate at least a portion of the wafer 56 comprised of masked areas and unmasked areas. Thereafter, in measuring the photo-induced voltage, the measurement accounts for the ratio between masked areas 72 and unmasked areas 74.

Figure 6A:
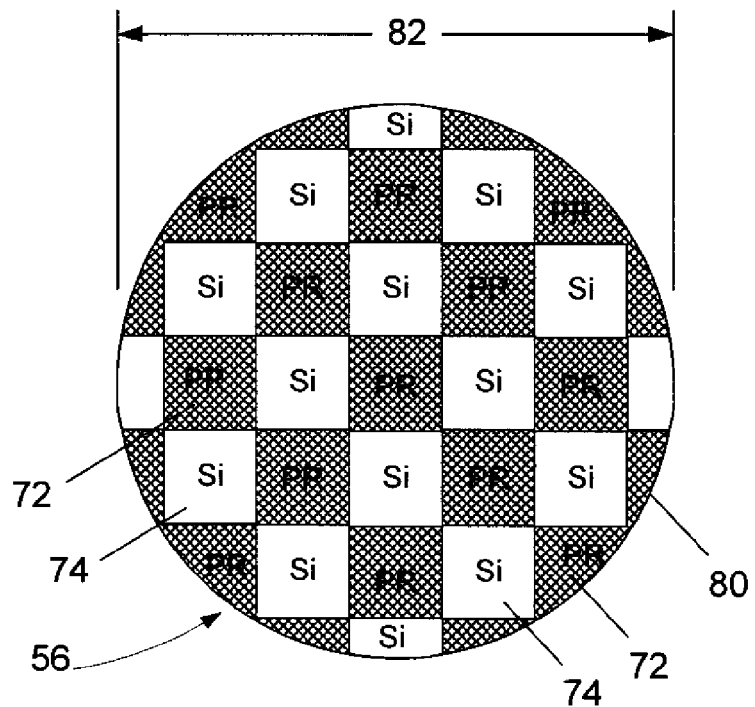
FIGS. 6A-6B depict various illustrative examples wherein the present invention may be employed to determine one or more characteristics of various doped regions.
Figure 6B:
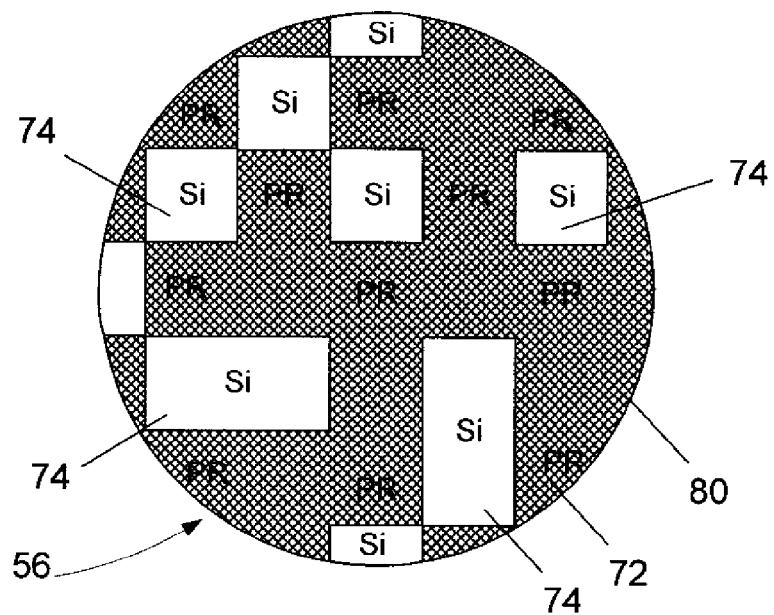

FIGS. 6A-6B are illustrative examples depicting the illumination area 80 used by the tool 52 in performing the surface photovoltage measurements described herein. In FIGS. 6A-6B, it is assumed that the patterned masking layer 70 is comprised of a photoresist material that is formed directly on the surface 57 of a silicon substrate 56. In the illustrative examples depicted in FIGS. 6A-6B, the illumination area 80 is a generally circular area having a diameter 82 of approximately 2 mm. A typical silicon open area on photoresist masked wafers may be about 50-100 microns in size due to the physical limitation of diamond saw cutting. As will be understood by those skilled in art after a complete reading of the present application, the illustrative patterns of the patterned masking layer 70 disclosed in FIGS. 6A-6B is provided by way of example only and should not be considered a limitation of the present invention. In the embodiment depicted in FIG. 6A, the patterned masking layer 70 has a uniform, checkerboard-type pattern. In the embodiment depicted in FIG. 6B, the patterned masking layer 70 reflects an irregular pattern scheme. It should also be clear from the foregoing that the configuration of the various masked areas 72 and unmasked areas 74 may be of any desired shape or configuration and they may be routed in any desired manner across the surface 57 of the substrate 56.

Figure 7:
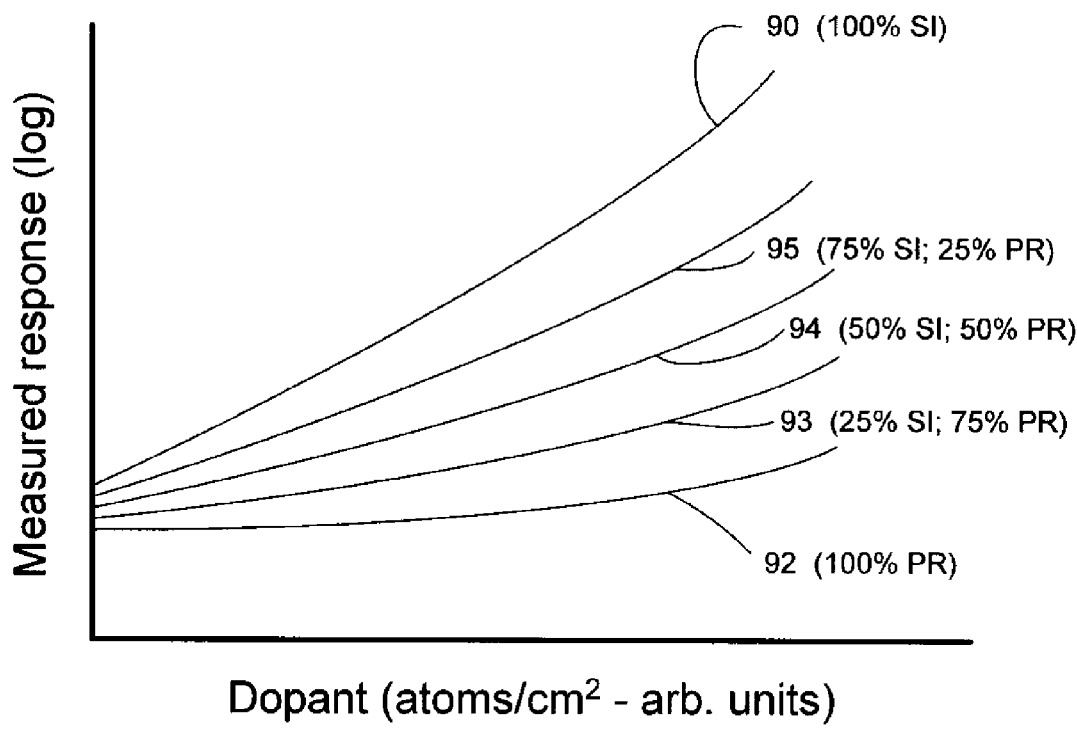
FIG. 7 is an illustrative graph depicting signals for various area ratios of masked and unmasked areas.

As indicated previously, in accordance with one aspect of the present invention, the surface photovoltage tool 52 is used to illuminate masked and unmasked portions of the substrate 56, and the measured surface photovoltage is measured while accounting for the ratio of exposed areas 74 to unexposed areas 72. FIG. 7 depicts an illustrative graph depicting measured response (log) on the vertical axis and dopant concentration (atoms/cm$^2$, in arbitrary units) on the horizontal axis. In measuring the surface photovoltage using the tool 52 described herein, a bare silicon surface provides a greater response than a photoresist surface. However, given that the relatively large exposure size 80 of the tool 52 will encompass both unmasked areas 74 and masked areas 72, the measured response needs to take into account the ratio of exposed and unexposed areas. For example, in FIG. 6, the line 90 reflects the response received by the tool 56 when it is illuminating a bare silicon substrate (100% silicon), whereas the line 92 indicates the measured response when the tool 52 illuminates an area completely covered by photoresist (100% PR). Lines 93, 94, 95 depict illustrative examples wherein the unmasked areas 74 gradually increase in percentage, e.g., 25%, 50%, and 75%, respectively. As can be seen from the graph depicted in FIG. 7, the larger the percentage of the unmasked area, e.g., silicon, the greater the measured response. However, even in situations in which the unmasked area, e.g., silicon, is relatively low, i.e., line 93 having an unmasked silicon area of approximately 25%, the measured response can still be employed to determine one or more characteristics of the doped regions 73 formed in the substrate 56.

The tool 52 may account for the masked-unmasked area ratios by a variety of techniques. For example, the unmasked-masked area ratio, or the size of the unmasked areas 74 and masked areas 72, may be provided to the tool 52 via the controller 66. Thereafter, the tool 52 may perform various internal calculations in determining the induced surface photovoltage wherein the unmasked-masked area ratios are accounted for. In another example, the controller 66 may access a plurality of curves stored in memory similar in nature to those depicted in FIG. 6 to determine the induced surface photovoltage. In such a case, once the masked-unmasked area ratio of the incoming wafers is determined, the tool may resort to the appropriate curve (stored in mathematical form) to measure the induced surface photovoltage. If necessary, the controller 66 may interpolate between a plurality of stored curves in determining the induced surface photovoltage.

The size of the masked areas 72 and the size of the unmasked areas 74, and any ratios therebetween, may be determined using a variety of techniques. For example, in some cases, one or more of the substrates 56 may actually be measured to determine the size of the masked and unmasked areas, whereas, in other cases, the size of the masked and unmasked areas may be determined based upon the intended design configuration of the patterned masking layer 70 after it has been formed. Moreover, in determining the magnitude of the various masked areas 72 and unmasked areas 74, average values may be employed, or, if it known that the tool 52 described herein will be used in a particular area of the substrate 56, the masked and unmasked areas may be determined for that localized area of the substrate 56. Lastly, as used herein, when it is stated that the surface photovoltage measurements are made, at least in part, based upon a ratio of the masked areas 72 to the unmasked areas 74, it is understood that the ratio may be in any form, i.e., the ratio of unmasked areas 74 to masked areas 72 (unmasked/masked), or the ratio of masked areas 72 to unmasked areas 74 (masked/unmasked). The information regarding the size of the masked and unmasked areas, or any ratios therebetween, may be provided to, or accessible by, the tool 52 via the controller 66.

The present invention is generally directed to various methods of determining characteristics of implant regions on device wafers, and a system for accomplishing same. In one embodiment, the method comprises providing a device substrate comprising a plurality of masked areas, a plurality of unmasked areas, and at least one doped region formed in the substrate, determining a ratio between the unmasked areas and the masked areas for the device substrate, illuminating an area of the device substrate comprising the masked areas, the unmasked areas, and the at least one doped region, and measuring an induced surface photovoltage of the device substrate while accounting for the ratio of the unmasked areas and the masked areas of the device substrate. At least one characteristic of the doped region may be determined based upon the measured surface photovoltage. In further embodiments, the method comprises modifying at least one parameter of a process operation used to form the at least one doped region, e.g., at least one parameter of an ion implant process, and performing the process operation comprised of the modified parameter on at least one subsequently processed device substrate to form a doped region therein.

In another illustrative embodiment, the method comprises providing a device substrate comprised of silicon, the device substrate comprising a plurality of masked areas, a plurality of unmasked areas, and at least one doped region formed in the substrate, determining a ratio of the unmasked areas to the masked areas for the device substrate, illuminating an area of the device substrate comprising the masked areas, the unmasked areas, and the at least one doped region, and measuring an induced surface photovoltage of the device substrate while accounting for the ratio of the unmasked areas to the masked areas of the device substrate.

In yet another illustrative embodiment, the method comprises providing a device substrate comprised of silicon, the device substrate comprising a plurality of masked areas, a plurality of unmasked areas, and at least one doped region formed in the substrate, determining a ratio of the masked areas to the unmasked areas for the device substrate, illuminating an area of the device substrate comprising the masked areas, the unmasked areas, and the at least one doped region, and measuring an induced surface photovoltage of the device substrate while accounting for the ratio of the masked areas to the unmasked areas of the device substrate.

Figure 8:
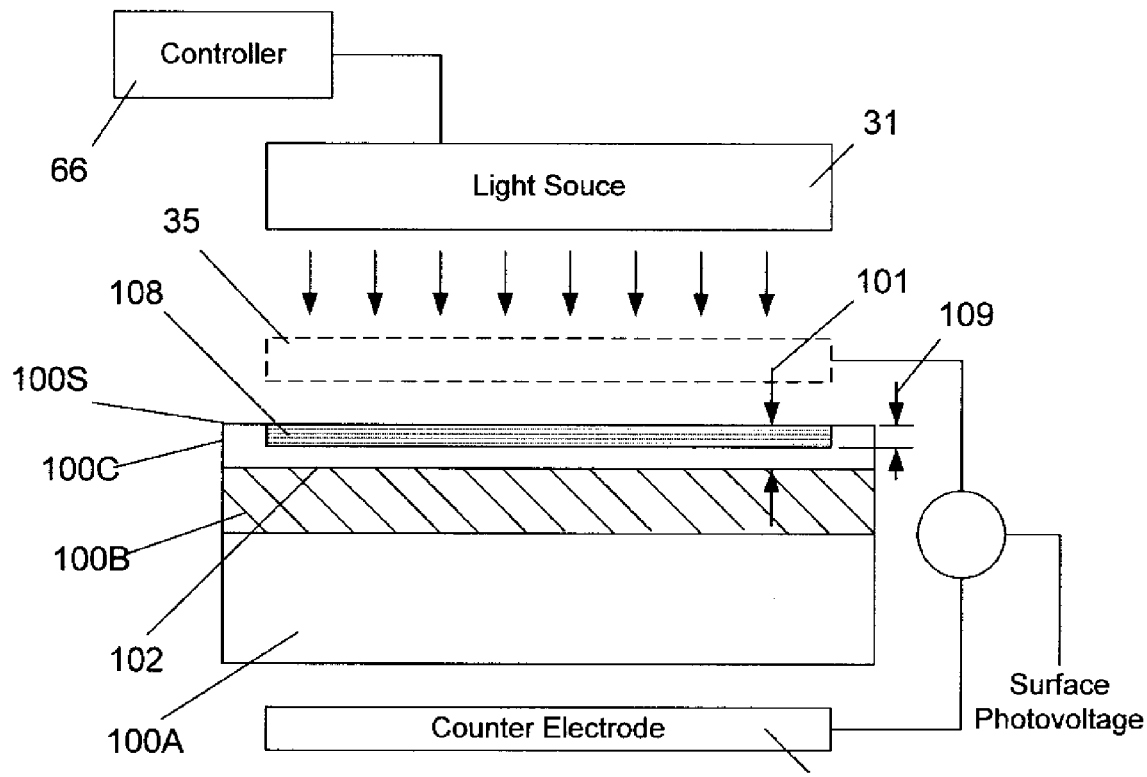
FIG. 8 is a side view depicting the measurement of an illustrative silicon-on-insulator substrate in accordance with one embodiment of the present invention.

In another aspect, the present invention is directed to a novel technique for measuring one or more characteristics of a doped region (not shown) formed in an active layer 100C of a silicon-on-insulator (SOI) substrate 100. The present invention may be employed in connection with the measurement of any of a variety of different types of doped regions formed in the active layer 100C. The SOI substrate 100 may be formed by a variety of known techniques. As indicated in FIG. 8, light from the light source 31 of the surface photovoltage tool 52 illuminates a portion of the surface 100S of the SOI substrate 100.

As indicated previously, the depth or thickness 101 of the active layer 100C may be very small, e.g., approximately 80 nm. In accordance with one aspect of the present invention, the light generated by the light source 31 has a relatively long wavelength, e.g., greater than 680 nm, e.g., infrared light. For example, in accordance with one aspect of the present invention, a lower energy light source 31, e.g., an infrared light source, may be used to illuminate a portion of the surface 100S of the active layer 100C. As a result of using a sufficiently long wavelength light source, the excited region 108 may have a depth 109 that is less than the depth or thickness 101 of the active layer 100C. In one particularly illustrative embodiment, the depth 109 may be approximately 50-70 nm. As a result of the limited depth of the excited region 108, interference resulting from the interface 102 between the active layer 100C and the buried insulation layer 100B may be reduced or eliminated. Thus, in accordance with one aspect of the present invention, the characteristics of doped regions formed in the active layer 100C of an SOI substrate 100 may be more accurately measured.

In accordance with another aspect of the present invention, the light source 31 may be adjustable such that the wavelength of light emitted therefrom may be varied. In this embodiment, the depth 109 of the excited region 108 can be varied as needed. The controller 66 may be used to adjust the wavelength of the light employed in the surface photovoltage metrology process. For example, the controller 66 may be able to change the light source wavelength to any value within an established acceptable range, e.g., 700-1000 nm. This ability to adjust the light source wavelength provides the ability to perform measurements on SOI substrates having active layers 100C of different thicknesses.

Figure 9:
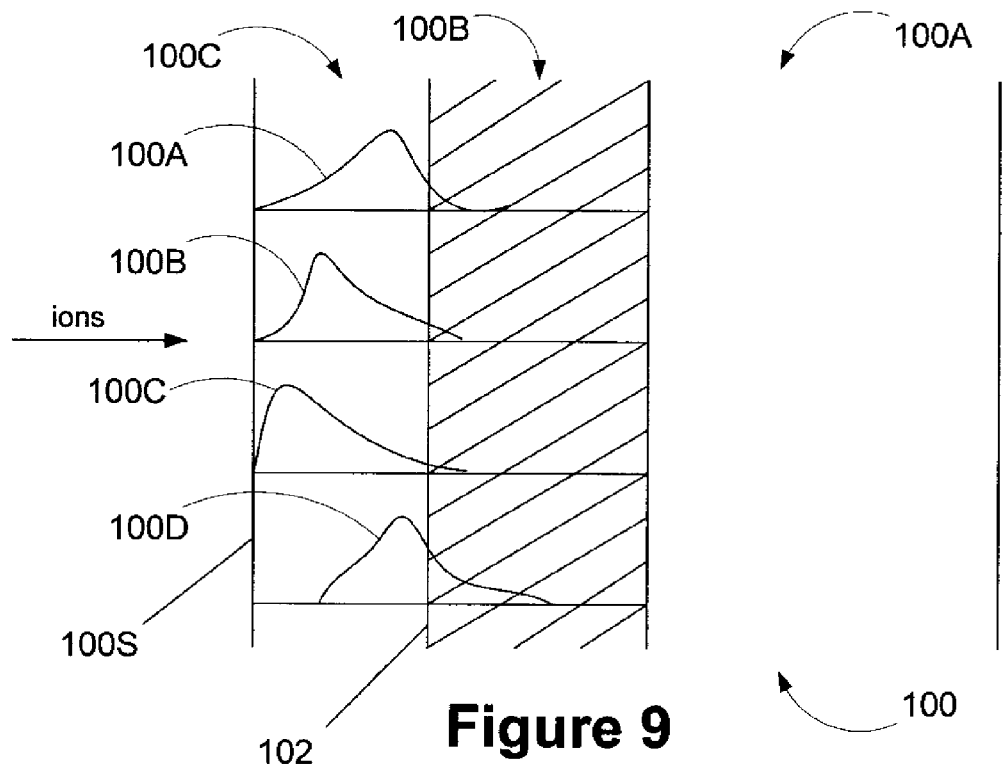
FIG. 9 is a chart depicting illustrative profiles for various doped regions.

FIG. 9 depicts a plurality of illustrative dopant concentration profiles 110A-110D for various doped regions (not shown) formed in an SOI substrate 100. The dopant profiles are intended to be representative of any of a variety of different doped regions formed in the SOI substrate 100. In some cases, the dopant material penetrates beyond the interface 102 between the active layer 100C and the buried insulation layer 100B. As a result, using prior art surface photovoltage techniques employing relatively short wavelength (high energy) light sources, the excited region caused by such a light source would extend beyond the depth of the interface 102, e.g., at least partially into the buried insulation layer 100B. Thus, the surface photovoltage measurements obtained would reflect at least some of the dopant material present in the SOI substrate 100 beyond the depth of the interface 102. In accordance with one aspect of the present invention, the wavelength of the light source is selected or controlled such that the excited region 108 does not extend beyond the depth of the interface 102. Accordingly, surface photovoltage measurements may more accurately reflect the characteristics of the dopant material present within the active layer 100C.

In one illustrative embodiment of the present invention, the method comprises providing an SOI substrate comprised of an active layer, the active layer having a thickness, illuminating an area of the substrate using a light source having a wavelength that is sufficiently long such that an excited region created in the active layer due to the illumination does not extend beyond the thickness of the active layer, and measuring an induced surface photovoltage resulting from the illumination. In further embodiments, the method comprises modifying at least one parameter of at least one process operation to be performed on at least one subsequently processed SOI substrate based upon the measured surface photovoltage and performing at least one process operation comprised of the modified at least one parameter on at least one subsequently processed SOI substrate. In a more specific example, at least one parameter of a process operation used to form at least one doped region on at least one subsequently processed SOI substrate may be modified based on the measured surface photovoltage and/or the determined characteristic of the doped region. Thereafter, the process operation comprised of the modified parameter may be performed to form one or more doped regions in the active layers of the subsequently processed SOI substrates.

In another illustrative embodiment, the method comprises providing an SOI substrate comprised of an active layer, the active layer having a thickness and at least one doped region formed therein, illuminating an area of the substrate including at least a portion of the at least one doped region using a light source having a wavelength that is sufficiently long such that an excited region created in the active layer due to the illumination does not extend beyond the thickness of the active layer, measuring an induced surface photovoltage resulting from the illumination, and determining at least one characteristic of the at least one doped region based upon the measured induced surface photovoltage.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
providing an SOI substrate comprised of an active layer, said active layer having a thickness;
illuminating an area of said substrate using a light source having a wavelength that is sufficiently long such that an excited region created in said active layer due to said illumination does not extend beyond said thickness of said active layer,
wherein said wavelength of said light source is greater than 680 nm; and
measuring an induced surface photovoltage resulting from said illumination.

2. The method of claim 1, wherein said active layer has a thickness of approximately 80 nm.

3. The method of claim 1, wherein said wavelength of said light source is between 680-1000 nm.

4. The method of claim 1, wherein said light source is an infrared light source.

5. The method of claim 1, further comprising at least one doped region formed in said active layer, wherein said step of illuminating an area of said SOI substrate comprises illuminating at least a portion of said at least one doped region.

6. The method of claim 5, further comprising determining at least one characteristic of said at least one doped region based upon said measured induced surface photovoltage.

7. The method of claim 1, wherein said active layer is comprised of silicon.

8. The method of claim 1, further comprising providing a controller that is adapted to adjust said wavelength of said light source.

9. The method of claim 1, further comprising:
modifying at least one parameter of at least one process operation to be performed on at least one subsequently processed SOI substrate based upon said measured surface photovoltage; and
performing said at least one process operation comprised of said modified at least one parameter on said at least one subsequently processed SOI substrate.

10. The method of claim 1, wherein said SOI substrate has a plurality of production integrated circuit devices formed in said active layer.

11. A method, comprising:
providing an SOI substrate comprised of an active layer, said active layer having a thickness and at least one doped region formed therein;
illuminating an area of said substrate including at least a portion of said at least one doped region using a light source having a wavelength that is sufficiently long such that an excited region created in said active layer due to said illumination does not extend beyond said thickness of said active layer, wherein said wavelength of said light source is greater than 680 nm;
measuring an induced surface photovoltage resulting from said illumination; and
determining at least one characteristic of said at least one doped region based upon said measured induced surface photovoltage.

12. The method of claim 11, wherein said wavelength of said light source is between 680-1000 nm.

13. The method of claim 11, wherein said light source is an infrared light source.

14. The method of claim 11, further comprising providing a controller that is adapted to adjust said wavelength of said light source.

15. The method of claim 11, further comprising:
modifying at least one parameter of at least one process operation to be performed on at least one subsequently processed SOI substrate based upon said determined characteristic of said at least one doped region; and
performing said at least one process operation comprised of said modified at least one parameter on said at least one subsequently processed SOI substrate to form a doped region.

16. The method of claim 11, wherein said SOI substrate has a plurality of production integrated circuit devices formed in said active layer.

17. A method, comprising:
providing an SOI substrate comprised of an active layer, said active layer having a thickness;
illuminating an area of said substrate using a light source having a wavelength that is sufficiently long such that an excited region created in said active layer due to said illumination does not extend beyond said thickness of said active layer;
measuring an induced surface photovoltage resulting from said illumination;
modifying at least one parameter of at least one process operation to be performed on at least one subsequently processed SOI substrate based upon said measured surface photovoltage; and
performing said at least one process operation comprised of said modified at least one parameter on said at least one subsequently processed SOI substrate.

18. The method of claim 17, wherein said active layer has a thickness of approximately 80 nm.

19. The method of claim 17, wherein said wavelength of said light source is greater than 680 nm.

20. The method of claim 17, wherein said wavelength of said light source is between 680-1000 nm.

21. The method of claim 17, wherein said light source is an infrared light source.

22. A method, comprising:
providing an SOI substrate comprised of an active layer, said active layer having a thickness and at least one doped region formed therein;
illuminating an area of said substrate including at least a portion of said at least one doped region using a light source having a wavelength that is sufficiently long such that an excited region created in said active layer due to said illumination does not extend beyond said thickness of said active layer;
measuring an induced surface photovoltage resulting from said illumination;
determining at least one characteristic of said at least one doped region based upon said measured induced surface photovoltage;
modifying at least one parameter of at least one process operation to be performed on at least one subsequently processed SOI substrate based upon said determined characteristic of said at least one doped region; and
performing said at least one process operation comprised of said modified at least one parameter on said at least one subsequently processed SOI substrate to form a doped region.

23. The method of claim 22, wherein said active layer has a thickness of approximately 80 nm.

24. The method of claim 22, wherein said wavelength of said light source is greater than 680 nm.

25. The method of claim 22, wherein said wavelength of said light source is between 680-1000 nm.

26. The method of claim 22, wherein said light source is an infrared light source.

* * * * *